United States Patent
Lo et al.

(10) Patent No.: US 9,147,808 B2
(45) Date of Patent: Sep. 29, 2015

(54) III-NITRIDE QUANTUM WELL STRUCTURE AND A LIGHT-EMITTING UNIT USING THE SAME

(71) Applicant: NATIONAL SUN YAT-SEN UNIVERSITY, Kaohsiung (TW)

(72) Inventors: I-Kai Lo, Kaohsiung (TW); Yu-Chi Hsu, Kaohsiung (TW); Cheng-Hung Shih, Kaohsiung (TW); Wen-Yuan Pang, Kaohsiung (TW); Ming-Chi Chou, Kaohsiung (TW)

(73) Assignee: NATIONAL SUN YAT-SEN UNIVERSITY, Kaohsiung (TW)

(*) Notice: Subject to any disclaimer, the term of this patent is extended or adjusted under 35 U.S.C. 154(b) by 0 days.

(21) Appl. No.: 14/523,684

(22) Filed: Oct. 24, 2014

(65) Prior Publication Data

US 2015/0102286 A1    Apr. 16, 2015

Related U.S. Application Data

(62) Division of application No. 14/057,856, filed on Oct. 18, 2013, now Pat. No. 8,916,458.

(30) Foreign Application Priority Data

Oct. 19, 2012 (TW) .............................. 101138778 A

(51) Int. Cl.
*H01L 29/06* (2006.01)
*H01L 31/00* (2006.01)
*H01L 33/32* (2010.01)
(Continued)

(52) U.S. Cl.
CPC ............ *H01L 33/32* (2013.01); *H01L 21/0254* (2013.01); *H01L 21/02389* (2013.01); *H01L 21/02458* (2013.01); *H01L 21/02494* (2013.01); *H01L 21/02631* (2013.01); *H01L 27/156* (2013.01); *H01L 33/0075* (2013.01); *H01L 33/04* (2013.01); *H01L 33/06* (2013.01); *H01L 33/20* (2013.01); *H01L 33/42* (2013.01)

(58) Field of Classification Search
None
See application file for complete search history.

(56) References Cited

U.S. PATENT DOCUMENTS 7,977,665 B2    7/2011   Moon
8,450,719 B2    5/2013   Moon
(Continued)

FOREIGN PATENT DOCUMENTS

TW    I393271 B1    4/2013

OTHER PUBLICATIONS

Nakamura et al., "High-Brightness InGaN Blue, Green and Yellow Light-Emitting Diodes with Quantum Well Structures," Jpn. J. App. Phys., vol. 34, pp. L797-L799 (1995).
(Continued)

*Primary Examiner* — Sonya D McCall Shepard
(74) *Attorney, Agent, or Firm* — Muncy, Geissler, Olds & Lowe P.C.

(57) ABSTRACT

An III-nitride quantum well structure includes a GaN base, an InGaN layer and an InGaN covering layer. The GaN base includes a GaN buffering layer, a GaN post extending from the GaN buffering layer, and a GaN pyramid gradually expanding from the GaN post to form a mounting surface. The InGaN layer includes first and second coupling faces. The first coupling face is coupled with the mounting surface. The GaN covering layer includes first and second coupling faces. The first coupling face of the GaN covering layer is coupled with the second coupling face of the InGaN layer.

16 Claims, 12 Drawing Sheets

(51) Int. Cl.
*H01L 33/06* (2010.01)
*H01L 33/00* (2010.01)
*H01L 27/15* (2006.01)
*H01L 33/20* (2010.01)
*H01L 21/02* (2006.01)
*H01L 33/04* (2010.01)
*H01L 33/42* (2010.01)

(56) References Cited

U.S. PATENT DOCUMENTS

| | | | |
|---|---|---|---|
| 8,529,822 B2 | 9/2013 | Chung et al. | |
| 2003/0107047 A1* | 6/2003 | Okuyama et al. | 257/95 |
| 2004/0048409 A1* | 3/2004 | Biwa et al. | 438/46 |
| 2008/0124827 A1 | 5/2008 | Huang et al. | |
| 2009/0098343 A1 | 4/2009 | Arena et al. | |
| 2010/0309172 A1* | 12/2010 | Oh et al. | 345/204 |
| 2011/0147772 A1 | 6/2011 | Lochtefeld et al. | |
| 2011/0254022 A1 | 10/2011 | Sasano | |
| 2011/0303896 A1 | 12/2011 | Brandes | |

OTHER PUBLICATIONS

Akabli et al., "Intersubbed Energies in $Al_{1-y}In_{y-N/GA1-x}In_xN$ heterostructures with lattice constant close to $a_{GaN1}$," Superlattices and Microstructures, vol. 52, pp. 70-77 (2012).

Vurgaftman et al., "Band parameters for nitrogen-containing semiconductors," J. Appl. Phys., vol. 94, No. 6, pp. 3675-3696 (Sep. 15, 2003).

Madelung, ed., Semiconductors: Group IV Elements and III-V Compounds (Data in Science and Technology), Spring, New York, pp. 86-91 (1991).

El-Masry et al., "Phase separation in InGaN grown by metalorganic chemical vapor deposition," Appl. Phys. Lett., vol. 72, No. 1, pp. 40-42 (Jan. 5, 1998).

* cited by examiner

III-NITRIDE QUANTUM WELL STRUCTURE AND A LIGHT-EMITTING UNIT USING THE SAME

CROSS REFERENCE TO RELATED APPLICATIONS

This application is a Divisional of co-pending application Ser. No. 14/057,856, filed on 18 Oct. 2013, for which priority is claimed under 35 U.S.C. §120; and this application claims priority of application Ser. No. 10/138,778, filed in Taiwan, R.O.C. on 19 Oct. 2012 under 35 U.S.C. §119, the entire contents of all of which are hereby incorporated by reference.

BACKGROUND OF THE INVENTION

1. Field of the Invention

The present invention generally relates to a quantum well structure and, more particularly, to a group-III nitride quantum well structure having a hexagonal shape.

2. Description of the Related Art

Group-III nitride semiconductors such as gallium nitride (GaN) and its alloys like indium gallium nitride (InGaN), aluminum gallium nitride (AlGaN) and indium aluminum nitride (InAlN) can be used to manufacture light-emitting elements due to wide direct band gaps thereof. These light-emitting elements include light-emitting diodes (LEDs) or laser diodes (LDs), for example. The performances of the light-emitting elements can be improved if the quantum well technology is used to produce said elements, as elaborated in the cited references listed in Table 1 below:

TABLE 1

The Characteristics of conventional Group-III Nitride

| Cited References | Related Information of The Cited References |
| --- | --- |
| 1 | S. Nakamura, M. Senoh, N. Iwasa, and S. Nagahama, Jpn. J. Appl. Phys. Lett. Part 1 34, L797 (1995) |
| 2 | H. Akabli, A. Almaggoussi, A. Abounadi, A. Rajira, K. Berland, T. G. Andersson, Superlattices and Microstructures 52 (2012) 70-77 |
| 3 | I. Vurgaftman and J. R. Meyer, J. Appl. Phys. 94, 3675 (2003) |
| 4 | Semiconductors: Group IV Elements and III-V Compounds(Data in Science and Technology), edited by O. Madelung (Spring, New York, 1991) |
| 5 | N. A. El-Masry, E. L. Piner, S. X. Liu, and S. M. Bedair, Appl. Phys. Lett. 72, 40 (1998) |

It can be recognized from the above cited references that the III-nitride semiconductors can be widely used to produce high-brightness LEDs (please refer to reference 1 for details). By adjusting the indium-gallium ratio of the $In_xGa_{1-x}N/GaN$ quantum well in the active layer of the light-emitting elements (namely, adjusting the indium content) can control the band gap of indium gallium nitride ($In_xGa_{1-x}N$) in the range of 0.7 eV to 3.4 eV. This range of band gap includes the wavebands of visible lights. Thus, a full-colored LED displayer can be manufactured by adjusting the waveband of the LEDs through the control of the indium content of said LEDs.

Furthermore, it can be observed from the relation chart between the band gap and the lattice constant of the group-III nitride (please refer to references 2 and 3 for details) that there is a significant lattice mismatch between gallium nitride ($a_{GaN}$=0.3189 nm, $c_{GaN}$=0.5185 nm) and indium nitride ($a_{InN}$=0.35446 nm, $c_{InN}$=0.57034 nm), as elaborated in the cited references 3 and 4. As a result, it is difficult to produce a high-quality InGaN/GaN quantum well.

However, indium atoms are volatile under high temperature (the melting point of indium is 156.6° C.), making it difficult to grow an epitaxial film of indium gallium nitride with large area and uniform distribution. Moreover, when a high-quality epitaxial layer of indium gallium nitride is grown, the epitaxial layer of indium gallium nitride is unable to contain more than 20% of indium (please refer to reference 5 for details). As a result, the wavebands of the LEDs are limited.

To solve the above problem, the commercial sapphire, silicon carbide (SiC) or silicon (Si)(111) may be used as a substrate. Based on this, the conventional plasma-assisted molecular beam epitaxy (PAMBE) mechanism is used to grow the epitaxial layer of indium gallium nitride ($In_xGa_{1-x}N$) under low temperature, so as to produce the light-emitting elements. However, the lattices match between the substrate and the epitaxial layer of indium gallium nitride still needs to be improved, which limits the performance of the light-emitting elements.

In conclusion, the conventional III-nitride quantum well structure has disadvantages of limited performance in addition to the limited waveband, which results in some limitations and inconveniences during the use. In light of this, it is necessary to improve the conventional quantum well structure.

SUMMARY OF THE INVENTION

It is therefore the objective of this invention to provide an III-nitride quantum well structure which forms an III-nitride alloy layer between an III-nitride cubic structure and an III-nitride epitaxy layer for improved light-emitting efficiency.

It is another objective of this invention to provide a method for manufacturing an III-nitride quantum well structure which grows the III-nitride alloy layer having larger than 20% of indium content on the III-nitride cubic structure and then grows the III-nitride epitaxy layer on said alloy layer. Thus, the III-nitride quantum well structure is formed.

It is a further objective of this invention to provide a light-emitting unit having a plurality of III-nitride quantum well structures each having a different amount of indium element for emitting a different wavelength of visible light.

In an embodiment, an III-nitride quantum well structure comprises a gallium nitride base, an indium gallium nitride layer and a gallium nitride covering layer. The gallium nitride base includes a gallium nitride buffering layer, a gallium nitride post extending from the gallium nitride buffering layer along an axis, and a gallium nitride pyramid gradually expanding from the gallium nitride post along the axis to form a mounting surface. The indium gallium nitride layer includes a first coupling face and a second coupling face opposite to the first coupling face. The first coupling face is coupled with the mounting surface of the gallium nitride base. The gallium nitride covering layer includes a first coupling face and a second coupling face opposite to the first coupling face of the gallium nitride covering layer. The first coupling face of the gallium nitride covering layer is coupled with the second coupling face of the indium gallium nitride layer.

In a form shown, the indium gallium nitride layer comprises indium and gallium elements having a total content ratio of 1.

In the form shown, the indium gallium nitride layer comprises indium, gallium and nitrogen elements, and the nitrogen element has a content ratio equal to a total content ratio of the indium and gallium elements.

In the form shown, the axis is a "c" axis of wurtzite.

In the form shown, the gallium nitride post is a hexangular post extending from the gallium nitride buffering layer along the axis, the gallium nitride pyramid is a truncated hexangular pyramid gradually expanding from the gallium nitride post along the axis, and the mounting surface is formed on an end of the gallium nitride pyramid that is not coupled with the gallium nitride post.

In the form shown, the III-nitride quantum well structure further comprises another indium gallium nitride layer coupled with the second coupling face of the gallium nitride covering layer, as well as another gallium nitride covering layer coupled with the other indium gallium nitride layer.

In a further embodiment, a light-emitting unit comprising a plurality of III-nitride quantum well structures is disclosed. The light-emitting unit comprises a body and a plurality of light-emitting cells arranged on the body. The light-emitting cells are adjacent to and coplanar with each other. Each of the plurality of light-emitting cells comprises a gallium nitride base, an indium gallium nitride layer, a gallium nitride covering layer and a conducting layer. The gallium nitride base, the indium gallium nitride layer and the gallium nitride covering layer are stacked together in order and are embedded in the body. The conducting layer is arranged on the gallium nitride covering layer.

In a form shown, the body comprises a semiconductor layer and an insulation layer coupled with the semiconductor layer. The gallium nitride base comprises a gallium nitride buffering layer, a gallium nitride post and a gallium nitride pyramid. The gallium nitride buffering layer is embedded in the semiconductor layer. The gallium nitride post, the gallium nitride pyramid, the indium gallium nitride layer and the gallium nitride covering layer are embedded in the insulation layer.

In the form shown, the plurality of light-emitting cells comprises first, second and third light-emitting cells. The first light-emitting cell has a wavelength of 450 nm to 520 nm, the second light-emitting cell has a wavelength of 520 nm to 560 nm, and the third light-emitting cell has a wavelength of 625 nm to 700 nm.

In the form shown, the indium gallium nitride layer of the first light-emitting cell has an indium content between 14% and 23%.

In the form shown, the indium gallium nitride layer of the second light-emitting cell has an indium content between 23% and 38%.

In the form shown, the indium gallium nitride layer of the third light-emitting cell has an indium content between 34% and 40%.

In the form shown, the conducting layer is a metallic ring or a transparent conducting film.

In the form shown, the conducting layer comprises a transparent conducting portion and a metal conducting portion electrically coupled with the transparent conducting portion.

In the form shown, the metal conducting portion surrounds the transparent conducting portion.

In the form shown, the transparent conducting portion is made of indium gallium oxide.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

Figure 1:
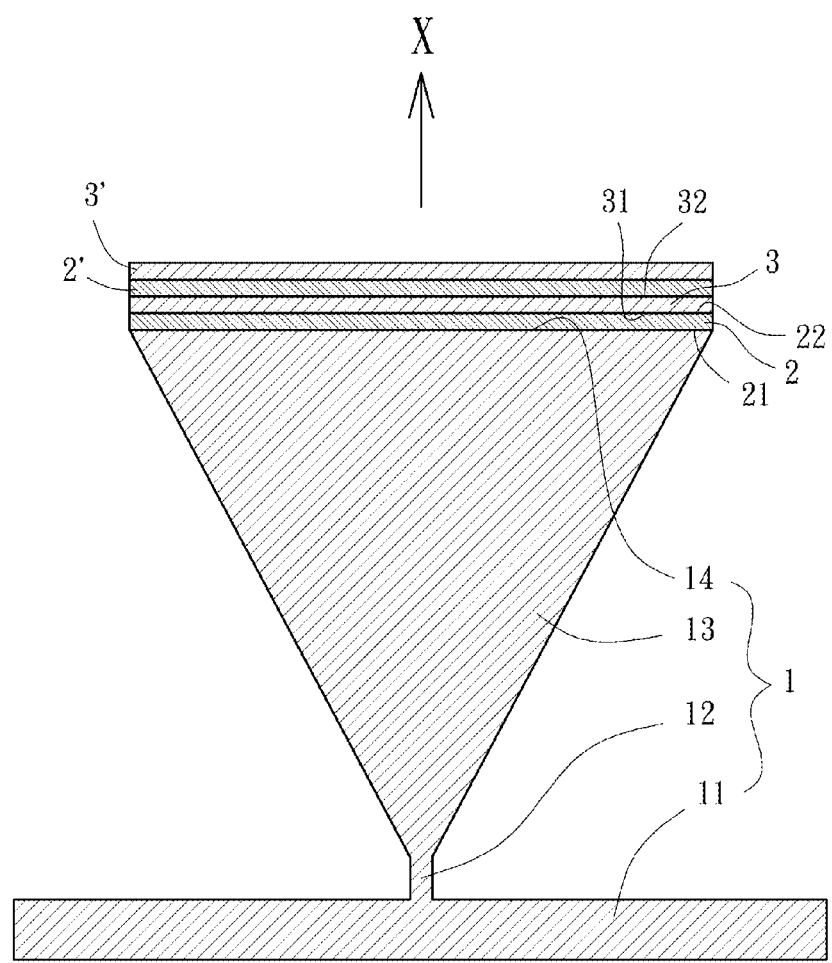
FIG. 1 is a cross-sectional view of an III-nitride quantum well structure according to an embodiment of the invention.

In the various figures of the drawings, the same numerals designate the same or similar parts. Furthermore, when the terms "first", "second", "third", "fourth", "inner", "outer", "top", "bottom", "front", "rear" and similar terms are used hereinafter, it should be understood that these terms have reference only to the structure shown in the drawings as it would appear to a person viewing the drawings, and are utilized only to facilitate describing the invention.

DETAILED DESCRIPTION OF THE INVENTION

The term "self-assembly" mentioned hereinafter refers to a substrate material that forms the required shape, structure and composition during the epitaxy process of Molecular Beam Epitaxy (MBE) mechanism by simply controlling the growth parameters (such as growth temperature, growth time, element ratio, etc) without conducting the lithographic process, the photolithograph process and the etching process, as it can be readily appreciated by one having ordinary skill in the art.

The term "truncated hexangular pyramid" mentioned hereinafter refers to a hexangular pyramid whose pointed end is truncated to form a truncated face and a bottom face at two ends thereof, in which the truncated face has a smaller area than the bottom face and both the truncated and bottom faces have a hexangular shape, as it can be readily appreciated by one having ordinary skill in the art.

The term "wurtzite" mentioned hereinafter refers to a hexangular mineral structure wherein the "c" axis denotes the [000-1] direction in the four dimensional coordinates system, as it can be readily appreciated by one having ordinary skill in the art.

The term "zinc-blende" mentioned hereinafter refers to a cubic mineral structure wherein the zinc-blende GaN and the wurtzite GaN are heterophased with each other, as it can be readily appreciated by one having ordinary skill in the art.

The term "beam equivalent pressure" mentioned hereinafter refers to the pressure of a metal source measured by an ion gauge when the metal source is heated in an ultrahigh vacuum environment to output vapor pressure towards the ion gauge, as it can be readily appreciated by one having ordinary skill in the art.

FIG. 1 is a cross-sectional view of a III-nitride quantum well structure according to an embodiment of the invention, which comprises a GaN base 1, an InGaN layer 2 and a GaN covering layer 3. InGaN layer 2 is sandwiched between GaN base 1 and GaN covering layer 3.

GaN base 1 is formed on a substrate (not shown) by epitaxial growth of GaN and comprises a GaN buffering layer 11, a GaN post 12 and a GaN pyramid 13. GaN buffering layer 11 is a film formed by epitaxial growth of GaN. GaN post 12 is a hexangular post formed on a surface of GaN buffering layer 11 along an axial direction "X". The axial direction "X" is the direction along the "c" axis of wurtzite in this embodiment. GaN pyramid 13 is a truncated hexangular pyramid extending from GaN post 12 in the axial direction "X", which is a self-assembled cubic epitaxial structure. The truncated hexangular pyramid has a first end connected to GaN post 12 and a second end opposite to the first end. The first end forms a truncated end and the second end forms a bottom end. The bottom end forms a mounting surface 14 for arrangement of InGaN layer 2. In this embodiment, GaN base 1 has a diameter of approximately 2.63 μm and a height of approximately 1.5 μm. According to the various figures of the application, GaN pyramid 13 is an inverted pyramid (but is not limited thereto).

InGaN layer 2 is a film formed by epitaxial growth of indium gallium nitride ($In_xGa_{1-x}N$, $0<x<1$) and forms a first coupling face 21 and a second coupling face 22 opposite to first coupling face 21. First coupling face 21 is coupled with mounting surface 14 of GaN base 1 and second coupling face 22 is adapted to be coupled by GaN covering layer 3. In this embodiment, InGaN layer 2 has a thickness of approximately 20 nm in order to form a high-quality GaN/InGaN quantum well.

The contents of individual elements of InGaN layer 2 are represented as "$In_xGa_{1-x}N$" wherein the indium and gallium elements have a total content ratio of 1 (namely, $0<x<1$). In addition, the content ratio of nitrogen element is preferably equal to the total content ratio of the indium and gallium elements. Based on this, the band gap range of InGaN layer 2 is able to include the wavebands of visible lights by adjusting the content of the indium element. Advantageously, a full-colored light-emitting element can be produced. In this embodiment, the content of the indium element "x" is 0.25, but is not limited thereto.

GaN covering layer 3 is a film formed by epitaxial growth of gallium nitride and forms a first coupling face 31 and a second coupling face 32 opposite to first coupling face 31. First coupling face 31 is coupled with second coupling face 22 of InGaN layer 2. In this regard, GaN base 1, InGaN layer 2 and GaN covering layer 3 together form a single quantum well (SQW). Second coupling face 32 may be coupled with another InGaN layer 2' such that InGaN layer 2' is able to couple with another GaN covering layer 3', thus forming multiple quantum wells (MQW). In this embodiment, GaN covering layer 3 has a thickness of 10 nm so that GaN base 1, InGaN layer 2 and GaN covering layer 3 are able to form a high-quality GaN/InGaN quantum well (but it is not to be taken as a limited sense).

Figure 2:
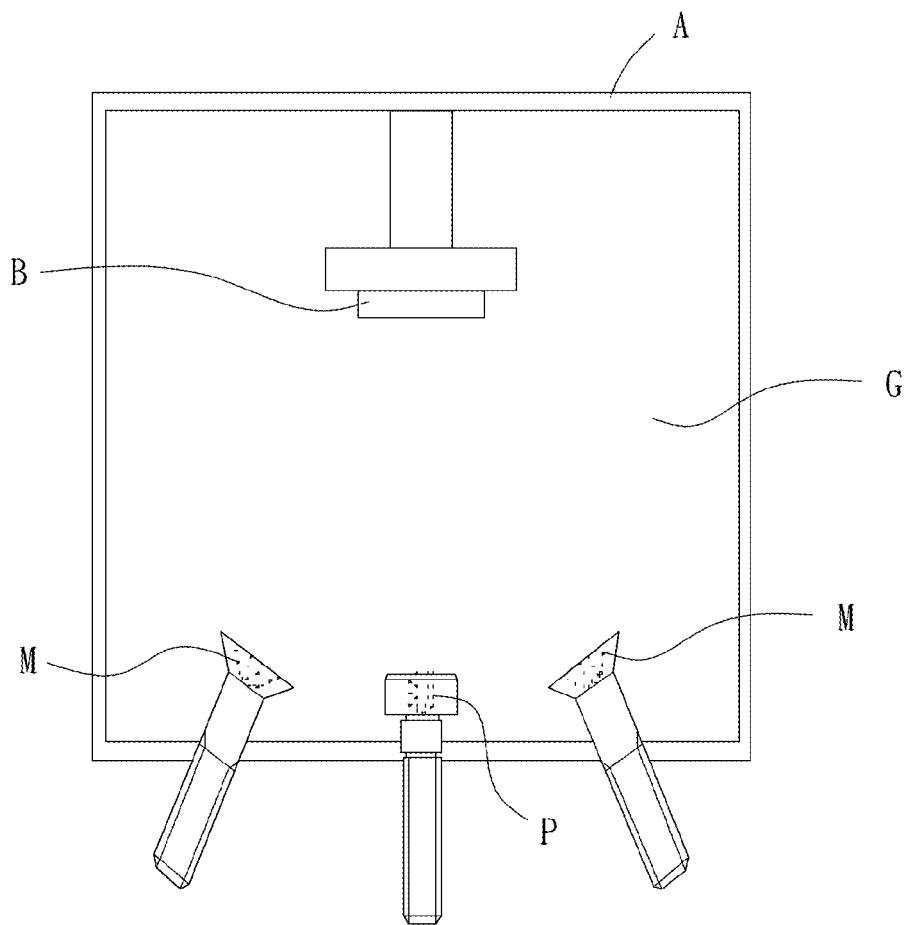
FIG. 2 shows a system for executing a method for manufacturing said quantum well structure according to the embodiment of the invention.

FIG. 2 shows a system for executing a method for manufacturing an III-nitride quantum well structure according to the embodiment of the invention. The conventional PAMBE system is used as an epitaxy equipment "A" when performing the method for manufacturing an III-nitride quantum well structure, which may be the one with the model name of Veeco Applied-EPI 930. As such, the epitaxial growth of the III-nitride quantum well structure can be conducted, such as heating or cooling the materials. The epitaxy equipment "A" includes a growth chamber "G", a substrate "B", group-III elements (which are metal sources "M" such as aluminum, indium, gallium, etc) and plasma nitrogen "P". The vapor pressure of a certain metal source "M" can be obtained by adjusting the temperatures of the metal sources "M" and the substrate "B" inside the growth chamber "G". In this regard, the plasma nitrogen "P" is used for the epitaxy purposes to grow the III-nitride quantum well structure on the substrate "B". The detailed structures and operations of the conventional PAMBE system are not described herein, as it can be readily appreciated by one having ordinary skill in the art.

Figure 3:
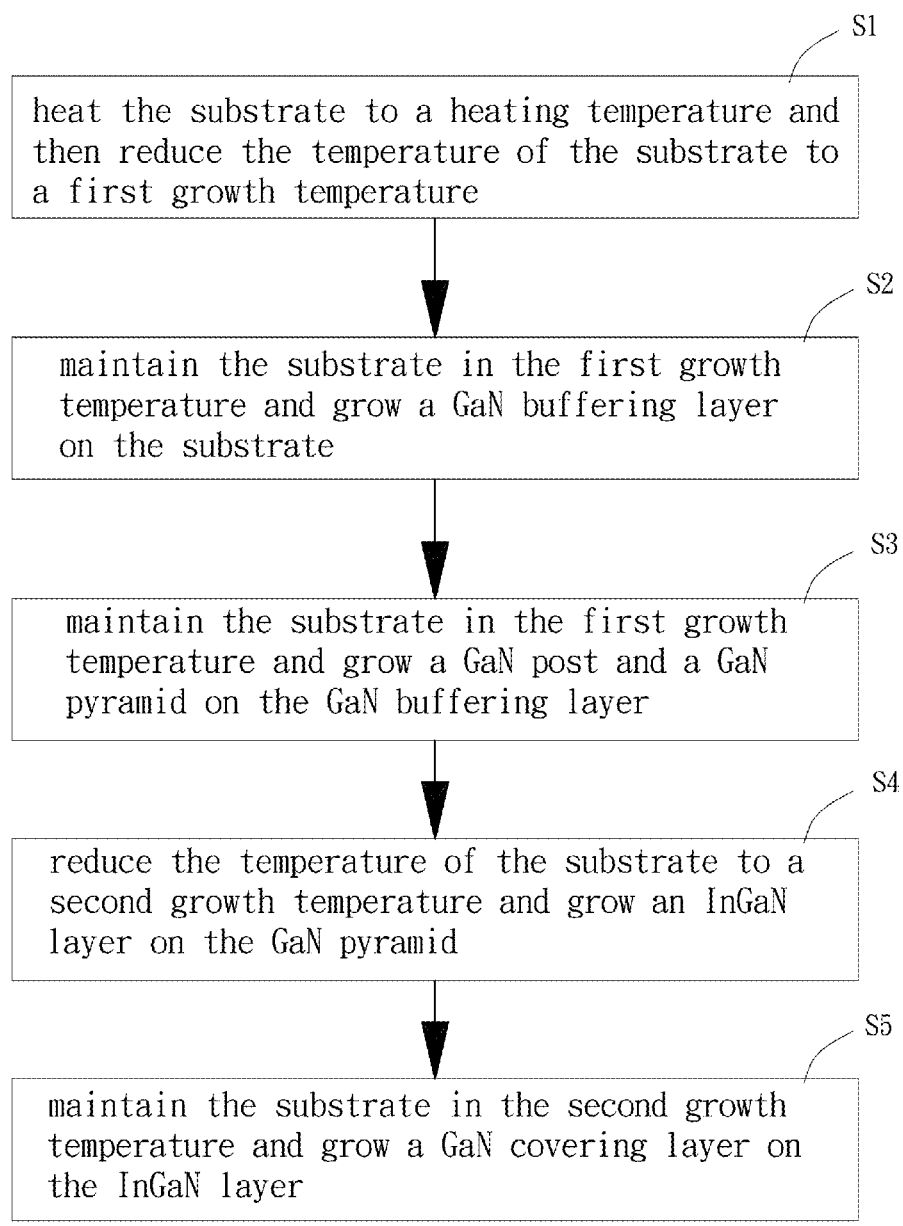
FIG. 3 shows a flowchart of the method for manufacturing said quantum well structure according to the embodiment of the invention.

FIG. 3 shows a flowchart of the method for manufacturing an III-nitride quantum well structure according to the embodiment of the invention, which comprises steps S1 to S5 as elaborated below.

In the step S1, the substrate "B" is heated to a heating temperature and then cooled down to a first growth temperature. The step S1 may be performed or omitted according to the requirement. Specifically, with reference to FIG. 2 also, the substrate "B" preferably goes through a heating process before the epitaxy equipment "A" starts the epitaxy process of the III-nitride quantum well structure. For example, the substrate "B" is heated to the heating temperature (such as between 750° C. and 850° C.) for a predetermined period of time (such as between 10 mins and 15 mins). In this manner, the surface of the substrate "B" may be maintained in a clean condition to reduce the lattices mismatch between the substrate "B" and the III-nitride quantum well structure. The substrate "B" may be a lithium aluminum ($LiAlO_2$) substrate, a lithium gallate ($LiGaO_2$) substrate or a zinc oxide (ZnO)

substrate to further lower the lattices mismatch between the substrate "B" and the III-nitride quantum well structure. In this embodiment, the substrate is a lithium aluminum (LiAlO$_2$) substrate, which may be produced based on the conventional Czochralski pulling technique. In addition, the substrate "B" is heated to 850° C. for 10 mins (but is not limited thereto) to ensure a clean surface of the substrate "B" as well as economical power consumption during the epitaxy process of the III-nitride quantum well structure.

Figure 4A:
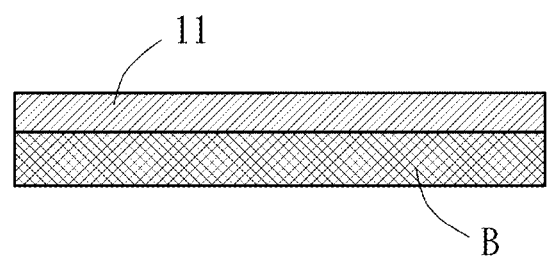
FIG. 4a shows a step of the method for manufacturing said quantum well structure wherein a GaN buffering layer is grown on a surface of a substrate by epitaxy according to the embodiment of the invention.

In the step S2, the substrate "B" is maintained in the first growth temperature and the ratio of the beam equivalent pressure between nitrogen and gallium is controlled as 91, so that a GaN buffering layer may be formed on the substrate by epitaxy. Specifically, referring to FIG. 4a also, when the epitaxy equipment "A" starts the epitaxy process of the III-nitride quantum well structure, the substrate "B" may be maintained in the first growth temperature (preferably 630° C.) in order to improve the epitaxy quality of the GaN buffering layer. Meanwhile, the ratio of the beam equivalent pressure between nitrogen and gallium is maintained as 91. For instance, the nitrogen power is controlled as 500 W. The magnitude of the nitrogen power is related to the amount of deionized nitrogen molecules. If the beam equivalent pressure of nitrogen (denoted as BEP$_N$) has a constant value of 8.34E−6 torr and the equivalent vapor pressure of gallium (denoted as BEP$_{Ga}$) is 9.15E−8 torr, in which BEP$_N$/BEP$_{Ga}$=(8.34E−6 torr)/(9.15E−8 torr)≈91. Based on this condition, GaN buffering layer 11 of GaN base 1 is able to grow on the surface of the substrate "B" by epitaxy. In this embodiment, the growth process of GaN buffering layer 11 is preferably maintained for a first growth time (such as 30 mins), such that GaN buffering layer 11 has a sufficient amount of volume for growing GaN post 12 and GaN pyramid 13.

Figure 4B:
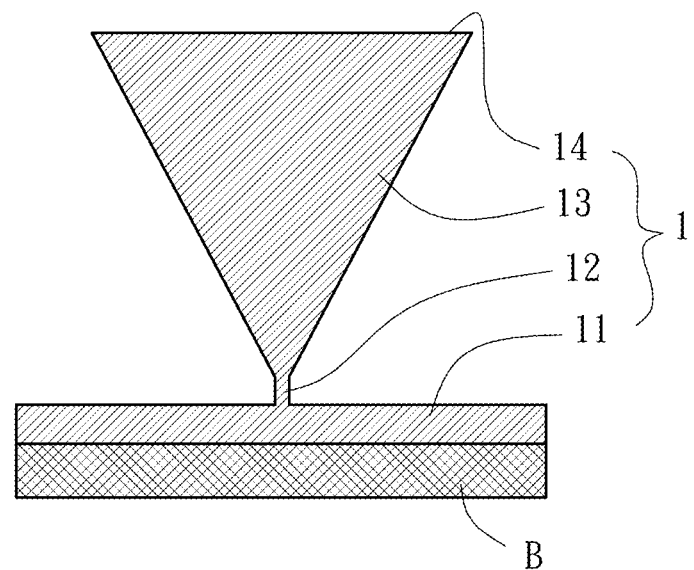
FIG. 4b shows another step of the method for manufacturing said quantum well structure wherein a GaN post and a GaN pyramid are grown on the GaN buffering layer by epitaxy according to the embodiment of the invention.

In the step S3, the substrate "B" is maintained in the first growth temperature and the ratio of the beam equivalent pressure between nitrogen and gallium is adjusted as 163. As such, a GaN post can be formed on the GaN buffering layer by epitaxy and a GaN pyramid can be formed on the GaN post by epitaxy. Specifically, referring to FIG. 4b also, after GaN buffering layer 11 is formed, the epitaxy equipment may maintain the substrate "B" in the first growth temperature and maintain the ratio of the beam equivalent pressure between nitrogen and gallium as 163. For example, the beam equivalent pressure of nitrogen BEP$_N$ is adjusted as 8.34E−6 torr and the equivalent vapor pressure of gallium BEP$_{Ga}$ is adjusted as 5.13E−8 torr, in which BEP$_N$/BEP$_{Ga}$=(8.34E−6 torr)/(5.13E−8 torr)≈163. Thus, GaN post 12 is able to grow on GaN buffering layer 11 by epitaxy. Then, GaN pyramid 13 is formed on GaN post 12 in a self-assembled manner. Since the volume of GaN post 12 is small and GaN pyramid 13 is gradually expanded from GaN post 12, the undesired phenomena of GaN pyramid 13 (lattice defects such as vacancy, dislocation or stacking fault) that are caused by the substrate "B" can be significantly reduced. In this embodiment, the epitaxy time of the step S3 is preferably maintained for a second growth time (such as 60 mins) in order for GaN pyramid 13 to have a sufficient amount of volume for growing InGaN layer 2.

Figure 4C:
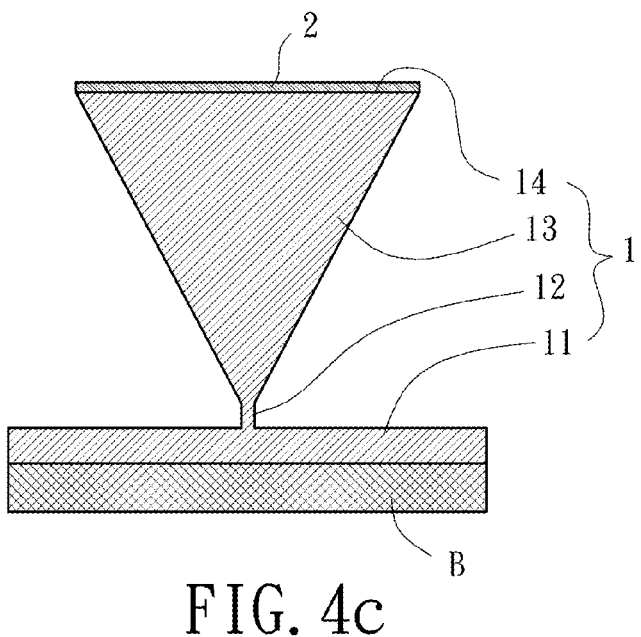
FIG. 4c shows yet another step of the method for manufacturing said quantum well structure wherein an InGaN layer is formed on the GaN pyramid by epitaxy according to the embodiment of the invention.

In the step S4, the temperature of the substrate is reduced to a second growth temperature and the ratios of the beam equivalent pressure between nitrogen, indium and gallium are adjusted as 4.99:1.19:1. Therefore, an InGaN layer 2 is able to form on the GaN pyramid. Referring to FIG. 4c also, after GaN pyramid 13 is formed, the epitaxy equipment "A" is able to reduce the temperature of the substrate "B" and maintain the substrate "B" in the second growth temperature (preferably 500° C.). Meanwhile, the ratios of the beam equivalent pressure between nitrogen, indium and gallium are maintained as 4.99:1.19:1. For example, the beam equivalent pressure of nitrogen BEP$_N$ is adjusted as 8.34E−6 torr, the equivalent vapor pressure of gallium BEP$_{Ga}$ is adjusted as 1.67E−8 torr, and the equivalent vapor pressure of indium BEP$_{In}$, is adjusted as 1.98E−8 torr. In this regard, BEP$_N$:BEP$_{In}$:BEP$_{Ga}$=4.99:1.19:1. Therefore, InGaN layer 2 can be formed on GaN pyramid 13 of GaN base 1 by epitaxy. Since the epitaxy process of InGaN layer 2 is performed under low temperature, volatilization of indium atoms during the epitaxy process can be prevented.

During the epitaxy process of InGaN layer 2 (In$_x$Ga$_{1-x}$N, 0<x<1), the epitaxy equipment "A" is able to adjust the beam equivalent pressures of nitrogen, indium and gallium, so as to control the content of the indium element "x". By adjusting the content of the indium element "x", the band gap range is able to include the wavebands of visible lights in order to produce the light-emitting elements having different wavelengths of visible lights. In this embodiment, the growth process in the step S2 is preferably maintained for a third growth time (such as 7.5 mins) in order for InGaN layer 2 to have a sufficient amount of volume for growing GaN covering layer 3.

In the step S5, the substrate is maintained in the second growth temperature and the ratio of the beam equivalent pressure between nitrogen and gallium is adjusted as 300 to 600, so that a GaN covering layer can be grown on the InGaN layer. Specifically, referring to FIG. 4d also, after InGaN layer 2 is formed, the epitaxy equipment may maintain the substrate "B" in the second growth temperature (such as 500° C.) and adjust the ratio of the beam equivalent pressure between nitrogen and indium as 300 to 600 (preferably 499). For example, the beam equivalent pressure of nitrogen BEP$_N$ is adjusted as 8.34E−6 torr, and the equivalent vapor pressure of gallium BEP$_{Ga}$ is adjusted as 1.67E−8 torr wherein BEP$_N$/BEP$_{Ga}$=(8.34E−6 torr)/(1.67E−8 torr)≈499. Therefore, the high-quality GaN covering layer 3 can be formed on the surface of InGaN layer 2 by epitaxy. In this embodiment, the growth process in the step S2 is preferably maintained for a fourth growth time (such as 7.5 mins) so that GaN base 1, InGaN layer 2 and GaN covering layer 3 are able to form a single quantum well.

The method for manufacturing an III-nitride quantum well structure according to the embodiment of the invention may further perform the steps S4 and S5 for the second time after the step S5 is finished for the first time. Accordingly, the other InGaN layer 2' is grown between GaN covering layer 3 and the other GaN covering layer 3' (as shown in FIG. 1). The steps S4 and S5 can be performed in multiple times to form the multiple quantum wells.

In order to verify the characteristics of the III-nitride quantum well structure, the III-nitride quantum well structure is taken as a sample for the following measuring purposes. In this regard, a dual beam scanning electron microscope (SEM, which has an accelerating voltage of 5 KV, for example) may be used to observe the surface of the sample. The microstructure of the sample can be observed by a high-resolution transmission electron microscopy (TEM) or analyzed by selected area diffraction (SAD). In order to observe the microstructure of the sample, a focused ion beam (FIB) equipment can be used to process a specimen. The sample formed on the specimen (namely, the nano-sized, disk-like object) can be cut in predetermined location and direction and its lattice structure can be represented by x-ray diffraction (XRD). Finally, the optical property of the sample is analyzed according to photoluminescence spectrum and cathode luminescence spectrum.

Figure 5C:
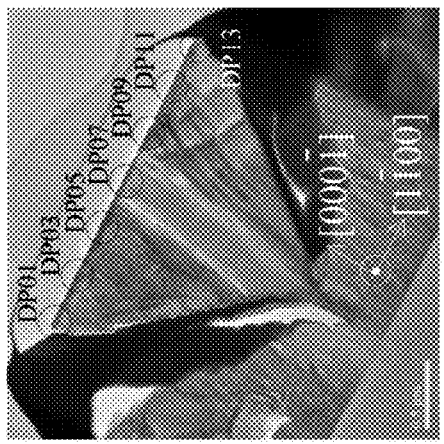
FIG. 5c shows a TEM bright-field image of the sample of said quantum well structure according to the embodiment of the invention.
Figure 5B:
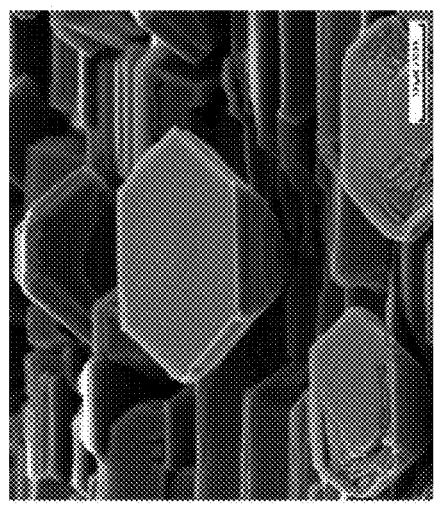
FIG. 5b shows another TEM-measured result of the sample of said quantum well structure according to the embodiment of the invention.
Figure 5A:
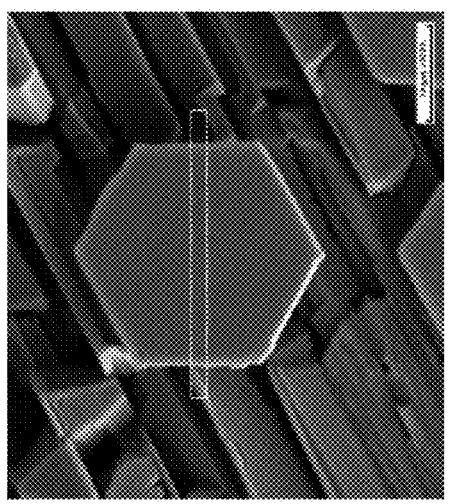
FIG. 5a shows a TEM-measured result of a sample of said quantum well structure according to the embodiment of the invention.

FIGS. 5a and 5b show the SEM-measured results of the sample of the III-nitride quantum well structure according to the embodiment of the invention. Specifically, FIG. 5a shows only the surface condition of said quantum well structure and FIG. 5b shows the general condition of said quantum well structure including the lateral part. It can be recognized from FIGS. 5a and 5b that said quantum well structure has a diameter of 2.63 mm and a height of 1.5 mm. TEM is used to analyze the microstructure of the sample and the FIB equipment is used to prepare the specimen used by TEM. The cutting direction is indicated by the dotted line in FIG. 5a (namely, the horizontal line in the center part of FIG. 5a), and the observation direction of TEM is [11-20].

Figure 5F:
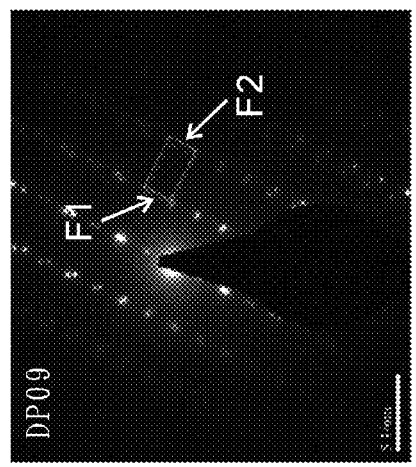
FIG. 5f shows a SAD result of DP09 in FIG. 5c.
Figure 5E:
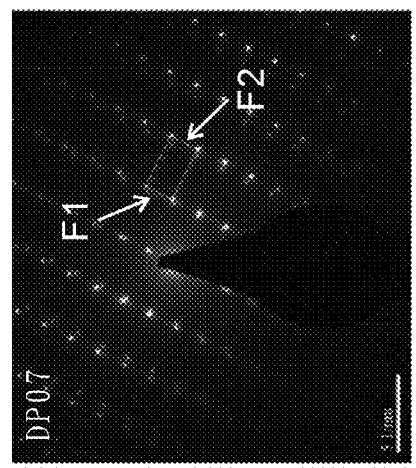
FIG. 5e shows a SAD result of DP07 in FIG. 5c.
Figure 5D:
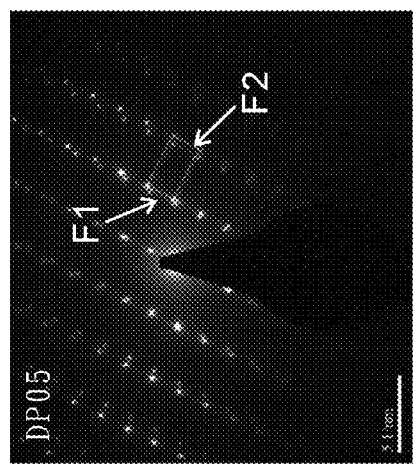
FIG. 5d shows a SAD result of DP05 in FIG. 5c.

FIG. 5c shows a TEM bright-field image of the III-nitride quantum well structure of the embodiment of the invention. The GaN base, the InGaN layer and the GaN covering layer are shown in FIG. 5c. The InGaN layer and the GaN covering layer have thicknesses of 20 nm and 10 nm, respectively. The imaging of SAD is carried out along the surface of the sample, including DP01, DP03, DP05, DP07, DP09, DP11 and DP13 from left to right. FIGS. 5d, 5e and 5f show the SAD results of DP05, DP07 and DP09 in FIG. 5c, respectively. It can be observed from FIGS. 5d, 5e and 5f that there are two separate rectangles (as indicated by red arrow F1 and yellow arrow F2), which indicates the presence of both InGaN and GaN.

Figure 5G:
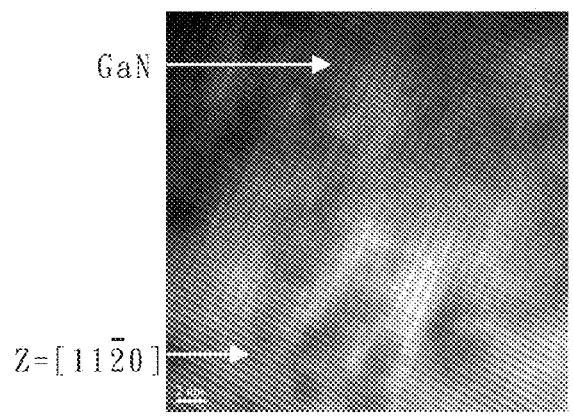
FIG. 5g shows a high-resolution atomic image of the sample of said quantum well structure according to the embodiment of the invention.
Figure 5H:
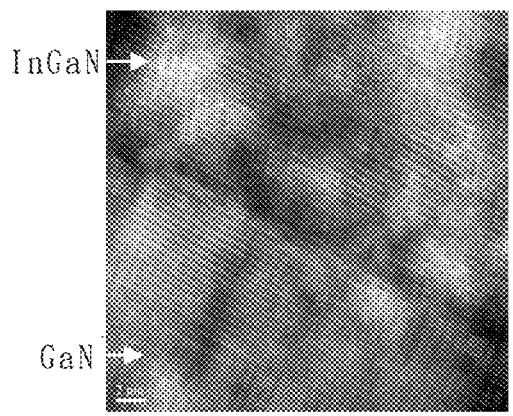
FIG. 5h shows another high-resolution atomic image of the sample of said quantum well structure according to the embodiment of the invention.
Figure 5I:
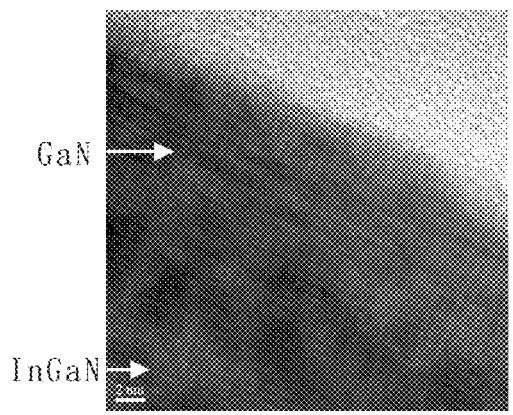
FIG. 5i shows a further high-resolution atomic image of the sample of said quantum well structure according to the embodiment of the invention.

FIGS. 5g, 5h and 5i show three high-resolution atomic images of the sample of the III-nitride quantum well structure of the embodiment of the invention. Specifically, FIG. 5g shows the GaN base, FIG. 5h shows the GaN base and the InGaN layer, and FIG. 5i shows the InGaN layer and the GaN covering layer. It can be recognized from FIGS. 5g, 5h and 5i that although the GaN covering layer has some defects resulting from the low growth temperature, one having ordinary skill in the art would realize that said quantum well structure has a high quality due to the orderly atom arrangement.

Figure 6:
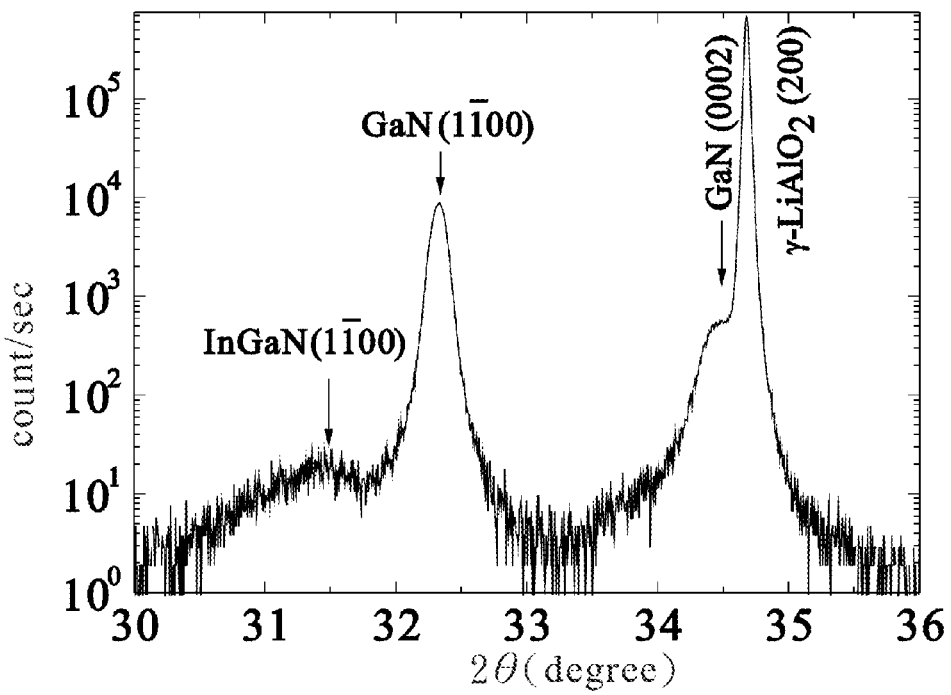
FIG. 6 shows a XRD result of the sample of said quantum well structure according to the embodiment of the invention.

FIG. 6 shows a XRD result of the sample of the III-nitride quantum well structure according to the embodiment of the invention. It is shown that the angle 2θ forms peaks at 31.49, 32.33, 34.49 and 34.68 degrees, representing the signals of the InGaN, the "M-axis" GaN (1-100), the "c-axis" GaN and the LiAlO$_2$ substrate, respectively. According to the peak location of the InGaN in FIG. 6 and Vegard's law, it can be obtained that the content of the indium element is 25%. Based on this, its corresponding band-gap value is 2.31 eV according to the formula $$Eg(x)[3.42-2.65*x-2.4*x*(1-x)]eV.$$

Figure 7A:
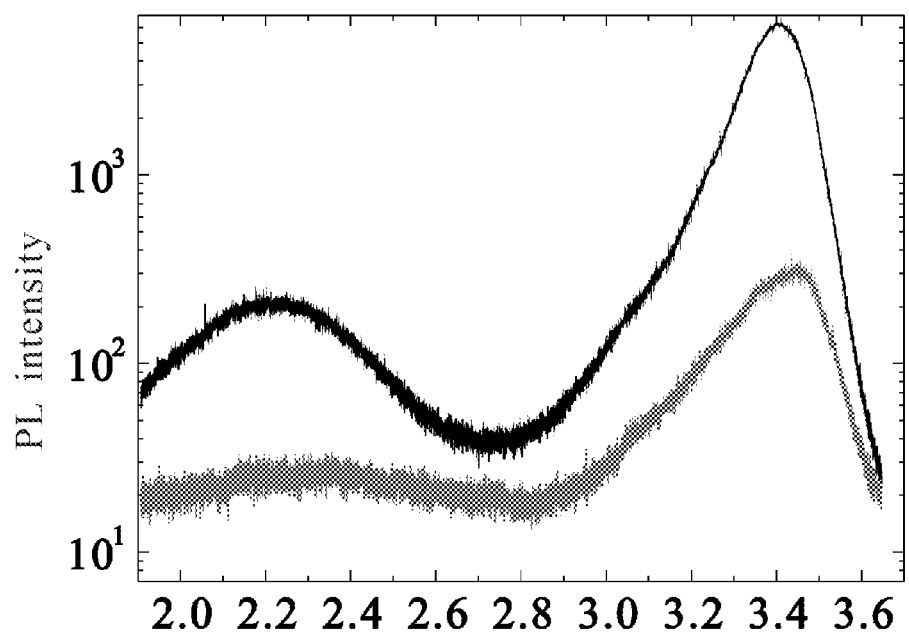
FIG. 7a shows a photoluminescence spectrum diagram of the sample of said quantum well structure according to the embodiment of the invention.
Figure 7B:
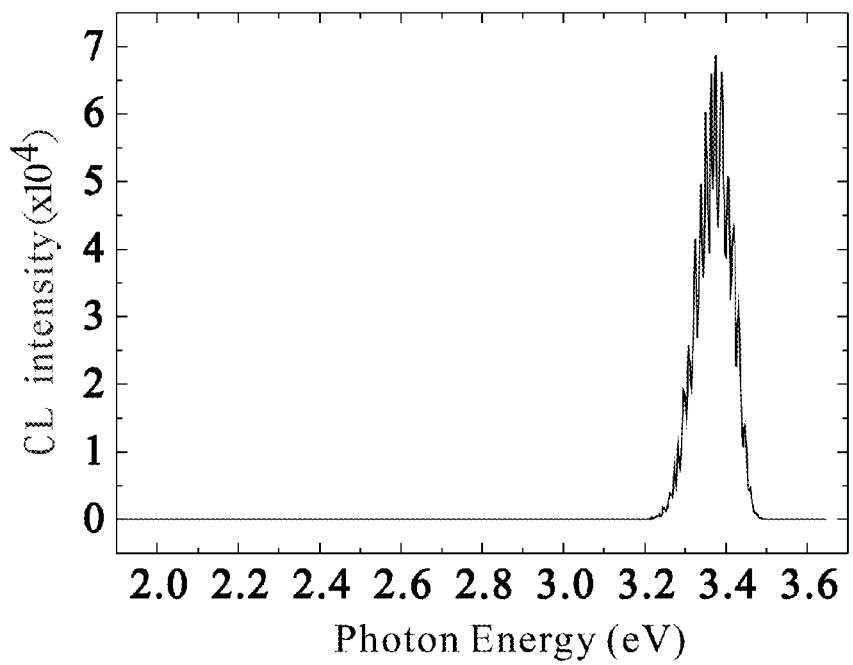
FIG. 7b shows a cathode-luminescence spectrum diagram of the sample of said quantum well structure according to the embodiment of the invention.
Figure 7C:
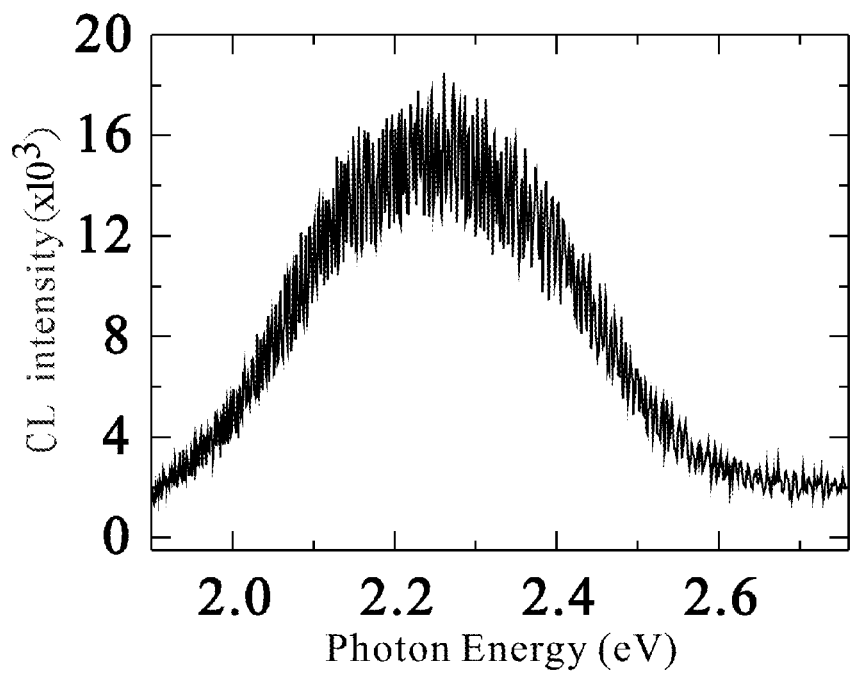
FIG. 7c shows another cathode-luminescence spectrum diagram of the sample of said quantum well structure according to the embodiment of the invention.

FIG. 7a shows a photoluminescence spectrum diagram of the sample of the III-nitride quantum well structure, FIG. 7b shows a cathode luminescence spectrum diagram of the sample of said quantum well structure, and FIG. 7c shows another cathode luminescence spectrum diagram of the sample of said quantum well structure. The photoluminescence spectrum and cathode-luminescence spectrum can be used to analyze the optical properties of the sample, as elaborated later.

As shown in FIG. 7a, the photoluminescence spectrums of the c-axis GaN base and the M-axis GaN covering layer of the sample of said quantum well structure were measured under room temperature, as indicated by the upper and lower waveforms, respectively. Then, the non-linear Gaussian curves are used to analyze the spectrums to obtain three peaks. The peak having a magnitude of approximately (3.426+0.001)eV is the band-gap transition of wurtzite GaN, the peak having a magnitude of approximately (3.214+0.002)eV is the band-gap transition of zinc-blende GaN, and the peak having a magnitude of approximately (2.213+0.001)eV is the band-gap transition of InGaN. Thus, the measurement results between photoluminescence spectrum and XRD are consistent.

Figure 4D:
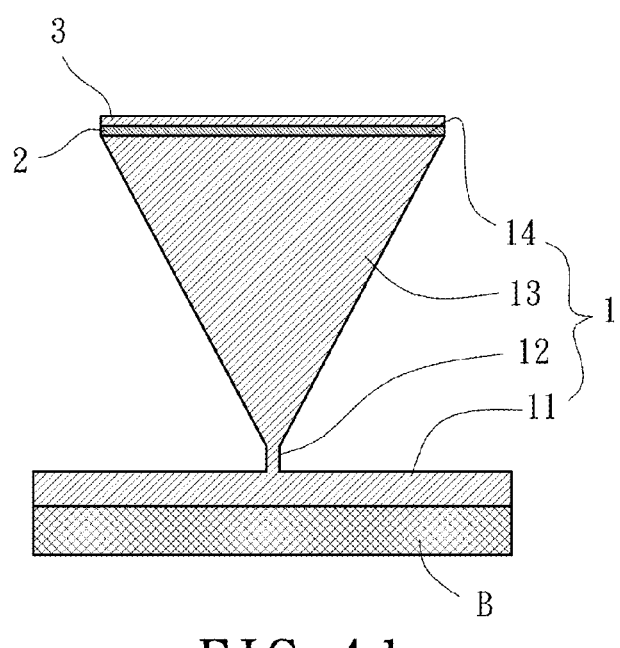
FIG. 4d shows a further step of the method for manufacturing said quantum well structure wherein a GaN covering layer is formed on the InGaN layer by epitaxy according to the embodiment of the invention.

FIGS. 7b and 7c show the measurement results of cathode luminescence spectrum under room temperature. Since the magnitude of the main signal is too large, a photomultiplier tube with an extraction voltage of 900V is used to measure the cathode luminescence spectrum. In this regard, the energy range of photons is between 1.9 eV to 3.65 eV, and it can be obtained that the energy of the main peak is (3.373+0.001)eV. This is the transition of free excitons of wurtzite GaN. However, the signal of InGaN is not obtained. Therefore, it is necessary to increase the extraction voltage of the photomultiplier tube by 1200 eV when measuring the cathode luminescence spectrum, so that the energy range of the photons is between 1.9 eV and 2.75 eV. In this condition, it can be obtained that the energy of the second peak is (2.259+0.001) eV. This is the band-gap transition of InGaN, and its spectrum is shown in FIG. 4d. Moreover, the energies at 3.38 eV, 3.20 eV and 2.27 eV are emitted by the III-nitride quantum well structure. Therefore, it is proven that the measurement result of the cathode luminescence spectrum is consistent with those of the photoluminescence spectrum and XRD.

Thus, the method for manufacturing an III-nitride quantum well structure according to the embodiment of the invention is able to grow said quantum well structure on the LiAlO2 substrate by simply using the PAMBE system while analyzing the structure and optical properties of the sample through TEM, XRD, CL and PL. The measurement results above show a good quality when the indium content of said quantum well structure is 25%. Therefore, said quantum well structure with 25% of indium content can be used to produce light-emitting elements (but this is not to be taken as a limited sense).

During the manufacturing process of the III-nitride quantum well structure, the indium content of said quantum well structure can be adjusted to produce light-emitting elements whose band gaps include different wavelengths of visible lights. As such, the produced light-emitting elements are able to emit visible lights with different wavelengths. Based on this, several III-nitride quantum well structures can be used to emit several visible lights with several wavelengths. The several visible lights can then be mixed to produce another visible light with a different wavelength. For example, red, green and blue lights can be mixed to produce white light. Mixtures of other colored lights are not described herein for brevity as they can be understood by one having ordinary skill in the art.

Figure 8:
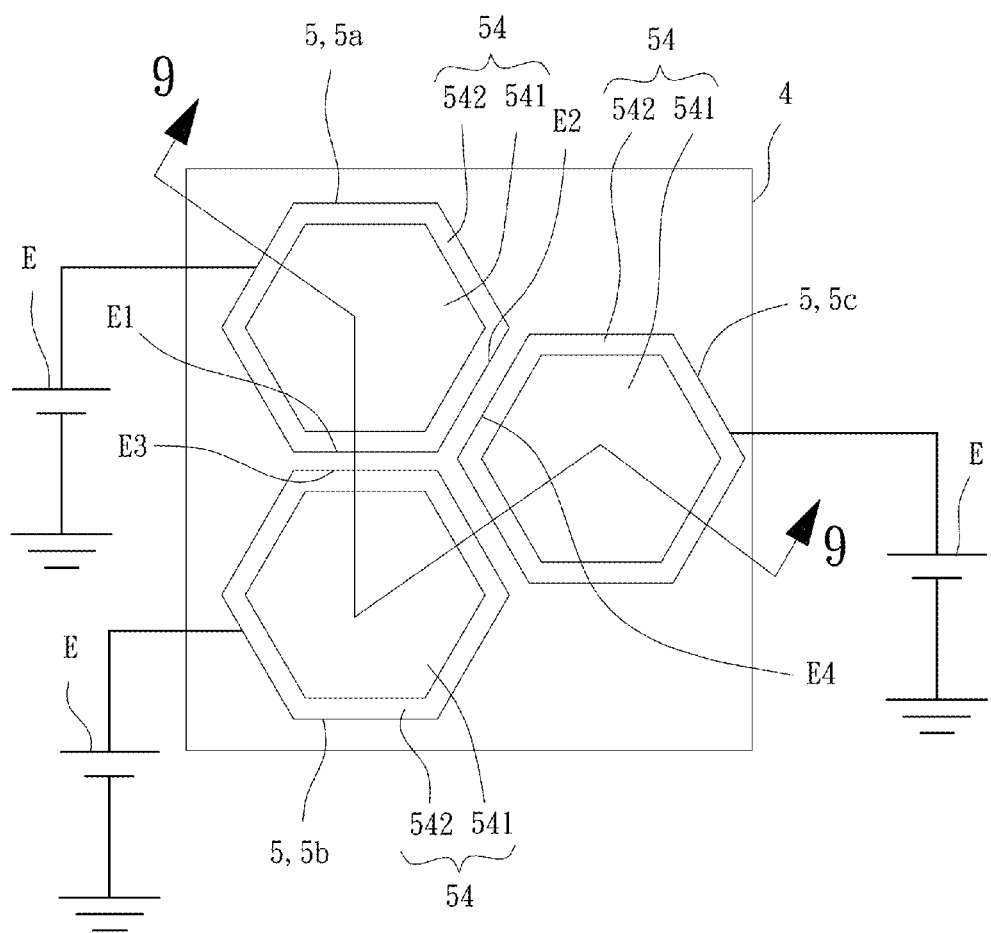
FIG. 8 shows a light-emitting unit having said quantum well structures according to the embodiment of the invention.
Figure 9:
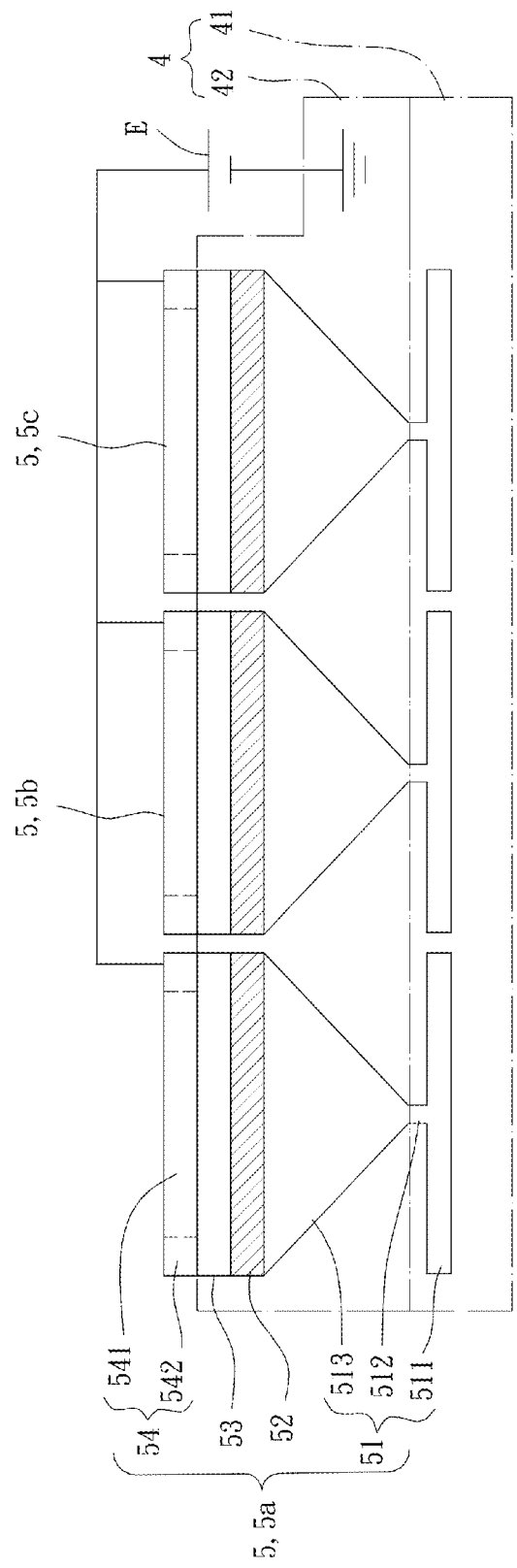
FIG. 9 is a cross-sectional view of the light-emitting unit according to the embodiment of the invention.

FIG. 8 shows a light-emitting unit having the III-nitride quantum well structures according to the embodiment of the invention. FIG. 9 shows a cross-sectional view of the light-emitting unit. The light-emitting unit includes a body 4 and a plurality of light-emitting cells 5. Light-emitting cells 5 are arranged on body 4 and are coplanar with each other. In addition, light-emitting cells 5 are located adjacent to each other so that the lights emitted thereby can be mixed.

Body 4 includes a semiconductor layer 41 and an insulation layer 42 coupled with semiconductor layer 41. Semiconductor layer 41 is provided for the mounting purpose of light-emitting cells 5 and is made of semiconductor material such as silicon (Si) or the like. Insulation layer 42 is made of insulation material such as silicon oxide (SiO$_2$). Light-emitting cells 5 are separate from each other by insulation layer 42 to ensure isolation among individual light-emitting cells 5. A negative end of an external power source "E" may be embedded in insulation layer 42, serving as a ground end of light-emitting cells 5.

Each light-emitting cell 5 includes a GaN base 51, an InGaN layer 52, a GaN covering layer 53 and a conducting layer 54. GaN base 51 includes a GaN buffering layer 511, a GaN post 512 and a GaN pyramid 513. The material and structure of InGaN layer 52 and GaN covering layer 53 are substantially the same as those of InGaN layer 2 and GaN covering layer 3, so they are not described herein for brevity. Similarly, the material and structure of GaN buffering layer 511, GaN post 512 and GaN pyramid 513 are substantially the same as those of GaN buffering layer 11, GaN post 12 and GaN pyramid 13, so they are not described herein for brevity.

GaN buffering layer 511 of GaN base 51 is embedded in semiconductor layer 41 of body 4. GaN post 512, GaN pyramid 513, InGaN layer 52 and GaN covering layer 53 are stacked together in order and are embedded in insulation layer 42. Conducting layer 54 is made of electricity conducting material such as a metallic ring or a transparent conducting film. In addition, conducting layer 54 is arranged on GaN covering layer 53 and is electrically connected to a positive end of external power source "E". External power source "E" drives light-emitting cells 5 to emit lights. In this embodiment, conducting layer 54 includes a transparent conducting portion 541 and a metal conducting portion 542. Transparent conducting portion 541 is made of light-permeable material with electricity conductivity, such as indium gallium oxide (InGaO), so that the lights are able to pass transparent conducting portion 541 from GaN covering layer 53. Transparent conducting portion 541 and GaN covering layer 53 may (not must) have two hexagonal shapes similar to each other as shown in FIG. 8. Metal conducting portion 542 is made of metal material with excellent electricity conductivity (such as aurum (Au)) and is electrically connected to transparent conducting portion 541 and external power source "E". Metal conducting portion 542 may surround transparent conducting portion 541 and may have a hexagonal shape as shown in FIG. 8.

The quantity of light-emitting cells 5 may be determined based on the number of colors of lights that are required to be mixed to produce a desired color of light. For instance, three light-emitting cells 5 are used to respectively produce red, green and blue lights for generating white light. As described above, light-emitting cells 5 are adjacent to each other. As an example, light-emitting cells 5 may include three light-emitting cells 5a, 5b and 5c wherein light-emitting cell 5a has two adjoining edges E1 and E2 respectively in parallel to an edge E3 of the other light-emitting cell 5b and an edge E4 of the other light-emitting cell 5c, as shown in FIG. 8. The same can be applied to light-emitting cells 5b and 5c. However, this is not taken in a limited sense. In this arrangement, the lights produced by individual light-emitting cells 5 can be mixed to produce a mixed color of light. The mixed color of light may be further adjusted using a phosphor or a filter. In this embodiment, the indium content of InGaN layer 52 of light-emitting cell 5a may be between 14% and 23% so that light-emitting cell 5a produces blue light with a wavelength of 450 nm to 520 nm. In this case, the band gap thereof is between 2.38 eV and 2.76 eV. In addition, the indium content of InGaN layer 52 of light-emitting cell 5b may be between 23% and 38% so that light-emitting cell 5b produces green light with a wavelength of 520 nm to 560 nm. In this case, the band gap thereof is between 2.21 eV and 2.38 eV. Moreover, the indium content of InGaN layer 52 of light-emitting cell 5c may be between 34% and 40% so that light-emitting cell 5c produces red light with a wavelength of 625 nm to 700 nm. In this case, the band gap thereof is between 1.77 eV and 1.98 eV. The indium content of each light-emitting cell 5 can be adjusted according to the wavelength of a desired color of visible light, as it can be readily appreciated by one having ordinary skill in the art.

According to the above descriptions, the method for manufacturing an III-nitride quantum well structure according to the embodiment of the invention includes the follow features. First, the substrate is heated to a heating temperature and then cooled down to a first growth temperature. Second, the substrate is maintained in the first growth temperature and the ratio of beam equivalent pressure between nitrogen and gallium is adjusted as 91, so that a GaN buffering layer is formed on the substrate by epitaxy. Third, the substrate is maintained in the first growth time and the ratio of beam equivalent pressure between nitrogen and gallium is adjusted as 163, such that a GaN post is formed on the GaN buffering layer by epitaxy and a GaN pyramid is formed on the GaN post by epitaxy. Fourth, the temperature of the substrate is reduced to a second growth temperature and the ratios of beam equivalent pressure between nitrogen, indium and gallium are adjusted as 4.99:1.19:1, so that an InGaN layer is formed on the GaN pyramid. Fifth, the substrate is maintained in the second growth temperature and the ratio of beam equivalent pressure between nitrogen and gallium is adjusted as 300 to 600, so that a GaN covering layer is formed on the InGaN layer. Based on the procedures, the III-nitride quantum well structure of the embodiment of the invention can be formed, in which the GaN base includes the GaN buffering layer, the GaN post and the GaN pyramid while the InGaN layer is sandwiched between the GaN pyramid of the GaN base and the GaN covering layer.

In this regard, the contents of individual elements of the InGaN layer are represented as "$In_xGa_{1-x}N$" wherein the indium and gallium elements have a total content ratio of 1 ($0<x<1$). In addition, the content ratio of nitrogen is preferably equal to the total content ratio of the indium and gallium elements. Based on this, the band gap range of the InGaN layer is able to include the wavebands of visible lights by adjusting the content of the indium element. Advantageously, a full-colored light-emitting element can be produced.

Furthermore, as described previously, a plurality of III-nitride quantum well structures may be used to form a light-emitting unit having a plurality of light-emitting cells arranged in a coplanar manner. The light-emitting cells are adjacent to each other so that the lights produced thereby can be mixed to produce another light.

Therefore, the III-nitride quantum well structure according to the embodiment of the invention forms an III-nitride alloy layer (i.e. the InGaN layer) between an III-nitride cubic structure (i.e. the GaN base) and an III-nitride epitaxy layer (i.e. the GaN covering layer). Based on this property, the III-nitride quantum well structure according to the embodiment of the invention can be used to produce light-emitting elements having wavebands of visible lights, improving the light-emitting efficiencies of said elements. Thus, the problem of limited wavebands of the conventional III-nitride quantum well can be overcome.

Furthermore, the method for manufacturing an III-nitride quantum well structure according to the embodiment of the invention grows the III-nitride alloy layer having larger than 20% of indium content on the III-nitride cubic structure and then grows the III-nitride epitaxy layer on said alloy layer. Thus, the III-nitride quantum well structure is formed, which solves the problem of limited wavebands of the light-emitting elements that is caused by the difficulty in increasing the indium content of the InGaN layer by more than 20% in the conventional method.

Moreover, as described above, the light-emitting unit having the III-nitride quantum well structures according to the embodiment of the invention includes the plurality of light-emitting cells mounted on the body. Each light-emitting cell includes said quantum well structure with different indium content to produce a different color of light. In this regards, the lights with different colors produced by the light-emitting cells can be mixed to produce a desired color of visible light.

Although the invention has been described in detail with reference to its presently preferable embodiments, it will be understood by one of ordinary skill in the art that various modifications can be made without departing from the spirit and the scope of the invention, as set forth in the appended claims.

What is claimed is:

1. An III-nitride quantum well structure comprising:
    a gallium nitride base having a gallium nitride buffering layer, a gallium nitride post extending from the gallium nitride buffering layer along an axis, and a gallium nitride pyramid gradually expanding from the gallium nitride post along the axis to form a mounting surface, wherein the mounting surface is distant to the gallium nitride post;
    an indium gallium nitride layer having a first coupling face and a second coupling face opposite to the first coupling face, wherein the first coupling face is coupled with the mounting surface of the gallium nitride base; and
    a gallium nitride covering layer having a first coupling face and a second coupling face opposite to the first coupling face of the gallium nitride covering layer, wherein the first coupling face of the gallium nitride covering layer is coupled with the second coupling face of the indium gallium nitride layer,
    wherein the gallium nitride pyramid gradually expands from the gallium nitride post to the indium gallium nitride layer.

2. The III-nitride quantum well structure as claimed in claim 1, wherein the indium gallium nitride layer comprises indium and gallium elements having a total content ratio of 1.

3. The III-nitride quantum well structure as claimed in claim 1, wherein the indium gallium nitride layer comprises indium, gallium and nitrogen elements, and wherein the nitrogen element has a content ratio equal to a total content ratio of the indium and gallium elements.

4. The III-nitride quantum well structure as claimed in claim 1, wherein the axis is a "c" axis of wurtzite.

5. The III-nitride quantum well structure as claimed in claim 1, wherein the gallium nitride post is a hexangular post extending from the gallium nitride buffering layer along the axis, wherein the gallium nitride pyramid is a truncated hexangular pyramid gradually expanding from the gallium nitride post along the axis, and wherein the mounting surface is formed on an end of the gallium nitride pyramid that is not coupled with the gallium nitride post.

6. The III-nitride quantum well structure as claimed in claim 1, further comprising another indium gallium nitride layer coupled with the second coupling face of the gallium nitride covering layer, as well as another gallium nitride covering layer coupled with the other indium gallium nitride layer.

7. A light-emitting unit having a plurality of III-nitride quantum well structures, comprising:
    a body; and
    a plurality of light-emitting cells arranged on the body, wherein the light-emitting cells are adjacent to and coplanar with each other,
    wherein each of the plurality of light-emitting cells comprises a gallium nitride base, an indium gallium nitride layer, a gallium nitride covering layer and a conducting layer, wherein the gallium nitride base, the indium gallium nitride layer and the gallium nitride covering layer are stacked together in order and are embedded in the body, and wherein the conducting layer is arranged on the gallium nitride covering layer,
    wherein the plurality of light-emitting cells comprises first, second and third light-emitting cells, wherein the first light-emitting cell has a wavelength of 450 nm to 520 nm, the second light-emitting cell has a wavelength of 520 nm to 560 nm, and the third light-emitting cell has a wavelength of 625 nm to 700 nm.

8. The light-emitting unit having a plurality of III-nitride quantum well structures as claimed in claim 7, wherein the body comprises a semiconductor layer and an insulation layer coupled with the semiconductor layer, wherein the gallium nitride base comprises a gallium nitride buffering layer, a gallium nitride post and a gallium nitride pyramid, wherein the gallium nitride buffering layer is embedded in the semiconductor layer, and wherein the gallium nitride post, the gallium nitride pyramid, the indium gallium nitride layer and the gallium nitride covering layer are embedded in the insulation layer.

9. The light-emitting unit having a plurality of III-nitride quantum well structures as claimed in claim 7, wherein the indium gallium nitride layer of the first light-emitting cell has an indium content between 14% and 23%.

10. The light-emitting unit having a plurality of III-nitride quantum well structures as claimed in claim 7, wherein the indium gallium nitride layer of the second light-emitting cell has an indium content between 23% and 38%.

11. The light-emitting unit having a plurality of III-nitride quantum well structures as claimed in claim 7, wherein the indium gallium nitride layer of the third light-emitting cell has an indium content between 34% and 40%.

12. The light-emitting unit having a plurality of III-nitride quantum well structures as claimed in claim 7, wherein the conducting layer is a metallic ring.

13. The light-emitting unit having a plurality of III-nitride quantum well structures as claimed in claim 7, wherein the conducting layer is a transparent conducting film.

14. The light-emitting unit having a plurality of III-nitride quantum well structures as claimed in claim 7, wherein the conducting layer comprises a transparent conducting portion and a metal conducting portion electrically coupled with the transparent conducting portion.

15. The light-emitting unit having a plurality of III-nitride quantum well structures as claimed in claim 14, wherein the metal conducting portion surrounds the transparent conducting portion.

16. The light-emitting unit having a plurality of III-nitride quantum well structures as claimed in claim 14, wherein the transparent conducting portion is made of indium gallium oxide.

* * * * *